(12) United States Patent
Shigihara

(10) Patent No.: US 7,949,027 B2
(45) Date of Patent: May 24, 2011

(54) SEMICONDUCTOR LASER DEVICE

(75) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 103 days.

(21) Appl. No.: 12/407,822

(22) Filed: Mar. 20, 2009

(65) Prior Publication Data

US 2010/0118904 A1  May 13, 2010

(30) Foreign Application Priority Data

Nov. 13, 2008 (JP) ................................ 2008-290923

(51) Int. Cl.
*H01S 5/00* (2006.01)
(52) U.S. Cl. .................................................... 372/46.01
(58) Field of Classification Search .................. None
See application file for complete search history.

(56) References Cited

U.S. PATENT DOCUMENTS

| | | | | |
|---|---|---|---|---|
| 4,881,236 A | * | 11/1989 | Brueck et al. | 372/45.01 |
| 6,804,280 B2 | * | 10/2004 | Shchukin et al. | 372/45.01 |
| 2004/0076209 A1 | * | 4/2004 | Bour et al. | 372/45 |
| 2004/0190584 A1 | * | 9/2004 | Spoonhower et al. | 372/108 |

FOREIGN PATENT DOCUMENTS

| | | |
|---|---|---|
| JP | 2001-298241 A | 10/2001 |
| JP | 2002-324948 A | 11/2002 |

OTHER PUBLICATIONS

Sebastian, J. et al., "High-Power 810-nm GaAsP-AlGaAs Diode Lasers with Narrow Beam Divergence", IEEE Journal on Selected Topics in Quantum Electronics, 7(2):334-339, Mar./Apr. 2001.

* cited by examiner

*Primary Examiner* — Minsun Harvey
*Assistant Examiner* — Sean Hagan
(74) *Attorney, Agent, or Firm* — Leydig, Voit & Mayer, Ltd.

(57) ABSTRACT

A semiconductor laser device includes: an n-type cladding layer; a p-type cladding layer; and an optical waveguide portion disposed between the n-type and p-type cladding layers and including spaced-apart active layers. The optical waveguide portion permits lasing in a crystal growth direction of the active layers in at least three modes, including the fundamental mode and two higher order modes. The number of active layers is equal to or greater than the number of extreme points of the electric field of a particular one of the higher order modes. At least one of the active layers is disposed near each extreme point of the electric field of the particular higher order mode, within the optical waveguide portion.

8 Claims, 5 Drawing Sheets

SEMICONDUCTOR LASER DEVICE

BACKGROUND OF THE INVENTION

1. Field of the Invention

The present invention relates to a semiconductor laser device.

2. Background Art

Semiconductor laser devices are known which are adapted to lase in the fundamental mode in the crystal growth direction, such as the semiconductor laser device disclosed in J. Sebastian et al., "High-Power 810-nm GaAsP-AlGaAs Diode Lasers With Narrow Beam Divergence," IEEE J. Select. Topics Quantum Electron., vol. 7, No. 2, pp. 334-339, 2001. In this semiconductor laser device, an active layer is disposed between thick guiding layers having the same thickness. Other prior art includes Japanese Laid-Open Patent Publication Nos. 2001-298241 and 2002-324948.

SUMMARY OF THE INVENTION

In recent years, there has been an increasing need to increase the electrical-to-optical power conversion efficiency of semiconductor laser devices in order to reduce the power consumption. The electrical-to-optical power conversion efficiency of a semiconductor laser device can be effectively increased by reducing its threshold current.

The threshold current in turn can be reduced by increasing the optical confinement factor in the active layer(s). However, there is a limit to increasing the optical confinement factor in the waveguide structure of semiconductor laser devices that lase in the fundamental mode in the crystal growth direction.

It is, therefore, an object of the present invention to provide an improved semiconductor laser device configured to be able to lase in at least the fundamental, first, and second order modes (i.e., lase in three or more modes), which device has a reduced threshold current and hence an increased electrical-to-optical power conversion efficiency.

According to one aspect of the present invention, a semiconductor laser device includes: an n-type cladding layer; a p-type cladding layer; and an optical waveguide portion disposed between the n-type and p-type cladding layers and including a plurality of active layers, the optical waveguide portion permitting lasing in a crystal growth direction in at least three modes including the fundamental mode and a plurality of high order modes. The number of the plurality of active layers is equal to or greater than the number of extreme points of the electric field of a particular one of the plurality of high order modes. At least one of the plurality of active layers is disposed near the location of each of a plurality of extreme points of the electric field of the particular high order mode within the optical waveguide portion.

Other and further objects, features and advantages of the invention will appear more fully from the following description.

DETAILED DESCRIPTION OF THE PREFERRED EMBODIMENTS

Basic Explanation

Figure 1:
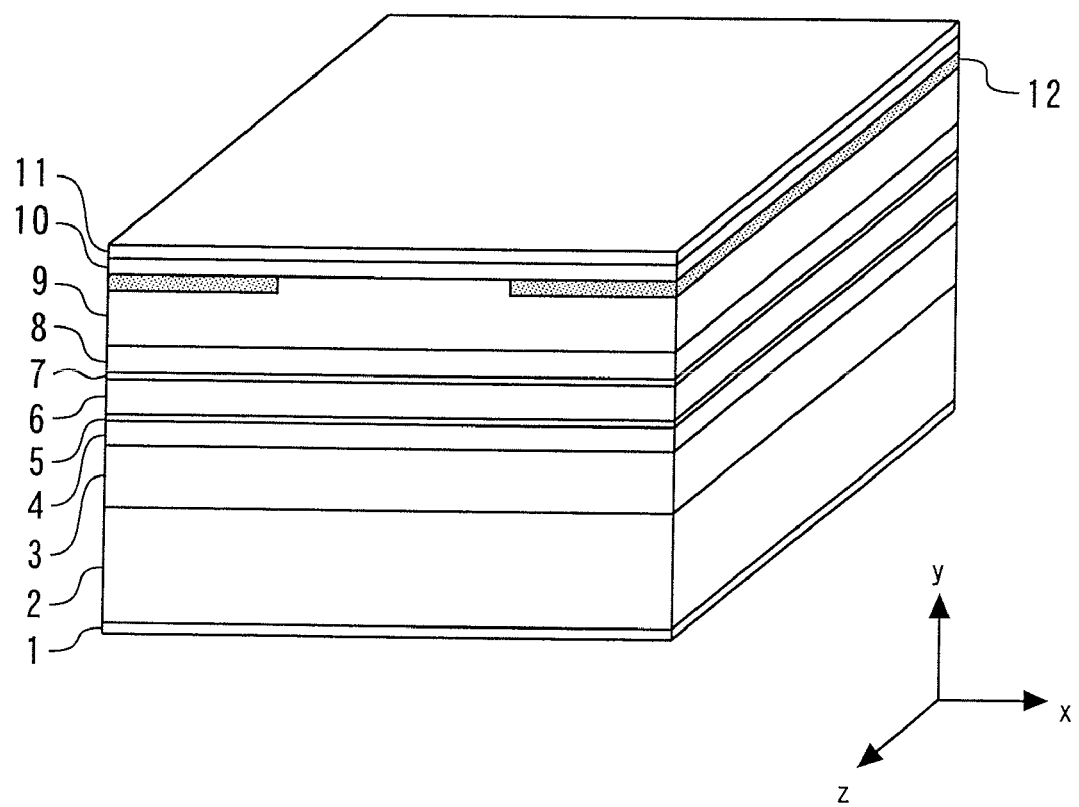
FIG. 1 is a perspective view of a semiconductor laser device used for a basic explanation about embodiments of the present invention.

Before describing embodiments of the present invention, it will be helpful to explain the overall concept of the invention in order to facilitate an understanding of these embodiments. FIG. 1 is a perspective view of a semiconductor laser device used for this basic explanation. This semiconductor device is an 810 nm semiconductor laser device. The reference numerals and corresponding components in FIG. 1 are as follows: 1, an n-electrode; 2, an n-type GaAs substrate; 3, an n-type $(Al_xGa_{1-x})_{0.51}In_{0.49}P$ cladding layer with a thickness of 1.5 µm (where the Al mole fraction x=0.30); 4, an n-side $In_{0.49}Ga_{0.51}P$ guiding layer with a thickness of 250 nm; 5, a $GaAs_{1-y}P_y$ active layer with a thickness of 10 nm (where y=0.12); 6, an $In_{0.49}Ga_{0.51}P$ barrier layer with a thickness of 500 nm; 7, a $GaAs_{1-y}P_y$ active layer with a thickness of 10 nm (where y=0.12); 8, a p-side $In_{0.49}Ga_{0.51}P$ guiding layer with a thickness of 250 nm; 9, a p-type $(Al_xGa_{1-x})_{0.51}In_{0.49}P$ cladding layer with a thickness of 1.5 µm (where the Al mole fraction x=0.30); 10, a p-type GaAs contact layer; 11, a p-electrode; and 12, proton implantation regions.

The semiconductor laser device is forward biased so that electrons are injected from the n-type $(Al_xGa_{1-x})_{0.51}In_{0.49}P$ cladding layer 3 toward the $GaAs_{1-y}P_y$ active layer 5 and holes are injected from the p-type $(Al_xGa_{1-x})_{0.51}In_{0.49}P$ cladding layer 9 toward the $GaAs_{1-y}P_y$ active layer 7. These electrons and holes flow into the $GaAs_{1-y}P_y$ active layers 5 and 7 via the n-side $In_{0.49}Ga_{0.51}P$ guiding layer 4, the $In_{0.49}Ga_{0.51}P$ barrier layer 6, and the p-side $In_{0.49}Ga_{0.51}P$ guiding layer 8.

Figure 2:
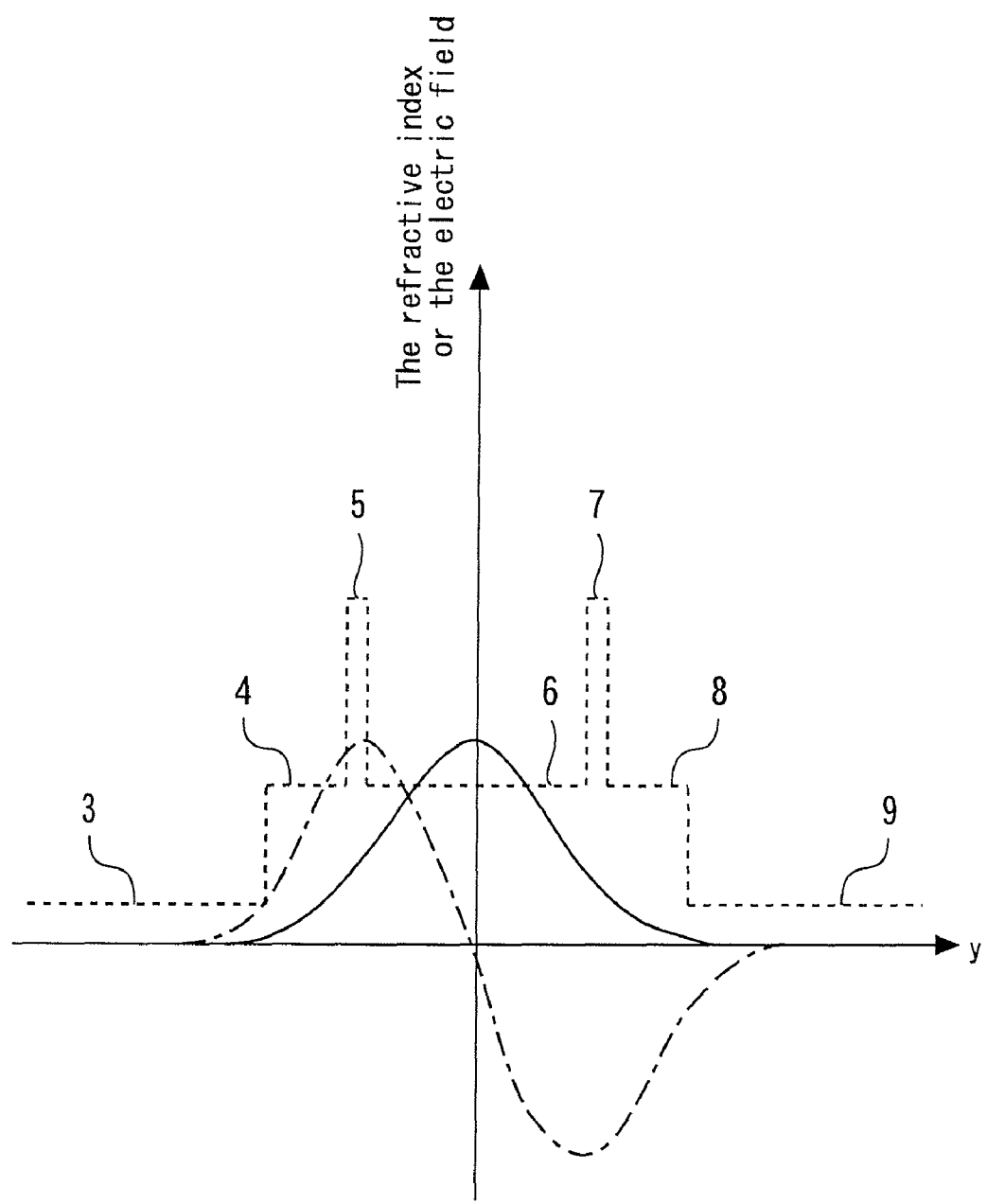
FIG. 2 shows the refractive index distribution and the electric field distribution in the semiconductor laser device of FIG. 1.

FIG. 2 shows the refractive index distribution (broken line), the electric field distribution of the fundamental mode (solid line), and the electric field distribution of the first order mode (chain line) in the semiconductor laser device of FIG. 1. This structure permits lasing in the first order mode in addition to the fundamental mode in the crystal growth direction (i.e., y-direction in FIG. 2). The sum of the optical confinement factors in the two active layers is 2.2% for the fundamental mode and 2.4% for the first order mode. Therefore, this semiconductor laser device preferentially lases in the first order mode. It will be noted that the optical confinement factor of an active layer is the percentage of light confined to the active layer.

For comparison purposes, a comparative semiconductor laser device having a single active layer will now be described. This comparative semiconductor laser device differs from the semiconductor laser device of FIG. 1 substantially in that it does not have the barrier layer 6, that the n-side $In_{0.49}Ga_{0.51}P$ guiding layer and the p-side $In_{0.49}Ga_{0.51}P$ guiding layer have a thickness of 500 nm, and that the active layer is sandwiched between these guiding layers. The optical confinement factor in the active layer of this comparative semiconductor laser device was found to be 1.6%. On the other hand, the semiconductor laser device of FIG. 1 has two active layers, which are disposed near the locations of extreme points of the electric field of the first order mode. As a result of this construction, the sum of the optical confinement factors of the active layers is very large, namely, 2.4%, resulting in a reduced threshold current and hence an increased electrical-to-optical power conversion efficiency.

This technique may also be applied to semiconductor laser devices configured to be able to lase in modes up to the second or higher order mode. That is, at least one active layer is disposed near the location of each of the extreme points of the electric field of a selected one of the high order modes. This increases the sum of the optical confinement factors of the active layers, resulting in a reduced threshold current and hence an increased electrical-to-optical power conversion efficiency.

This completes the basic explanation of the invention for facilitating understanding of embodiments thereof. The following description will be directed to first and second embodiments of the invention.

First Embodiment

Figure 3:
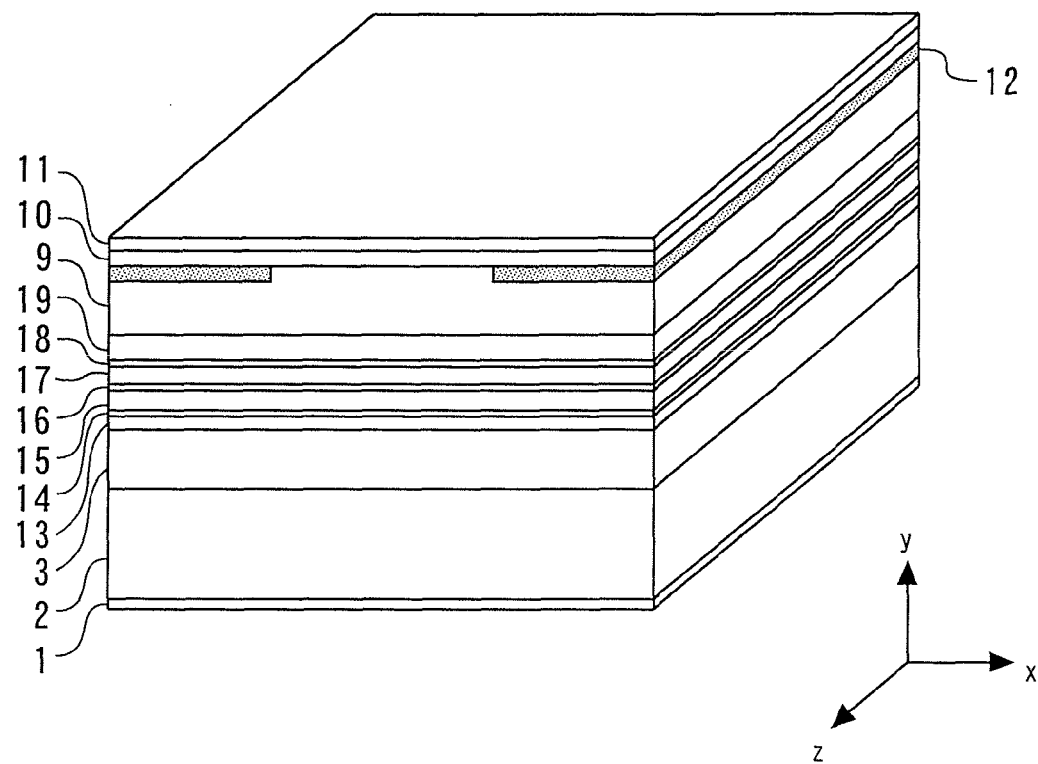
FIG. 3 is a perspective view of a semiconductor laser device according to the first embodiment of the present invention.

FIG. 3 is a perspective view of an 810 nm semiconductor laser device according to the first embodiment of the present invention. This semiconductor laser device is configured to lase in modes up to the second order mode, inclusive, and includes three active layers, which are disposed near the locations of extreme points of the electric field of the second order mode.

[Configuration of First Embodiment]

The configuration of the semiconductor laser device of the present embodiment will be first described with reference to FIG. 3. In FIG. 3, reference numeral 13 denotes an n-side $In_{0.49}Ga_{0.51}P$ guiding layer with a thickness of 100 nm; 14, a $GaAs_{1-y}P_y$ active layer with a thickness of 10 nm (where y=0.12); 15, an $In_{0.49}Ga_{0.51}P$ barrier layer with a thickness of 500 nm; 16, a $GaAs_{1-y}P_y$ active layer with a thickness of 10 nm (where y=0.12); 17, an $In_{0.49}Ga_{0.51}P$ barrier layer with a thickness of 500 nm; 18, a $GaAs_{1-y}P_y$ active layer with a thickness of 10 nm (where y=0.12); and 19, a p-side $In_{0.49}Ga_{0.51}P$ guiding layer with a thickness of 100 nm. The other components are identical to those carrying the same reference numerals in FIG. 1.

Figure 4:
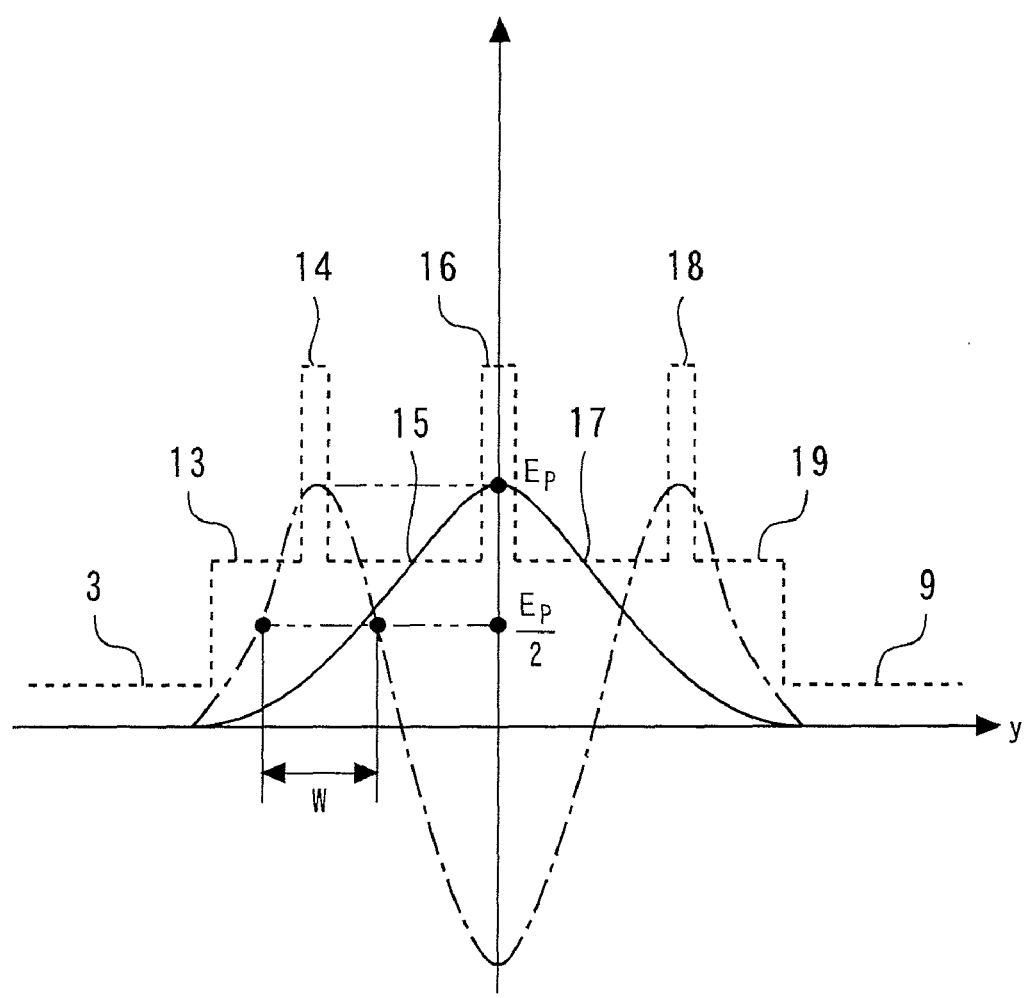
FIG. 4 shows the refractive index distribution and the electric field distribution in the semiconductor laser device according to the first embodiment of the present invention.

FIG. 4 shows the refractive index distribution (broken line), the electric field distribution of the fundamental mode (solid line), and the electric field distribution of the second mode (chain line) in the semiconductor laser device of the present embodiment. The structure of the semiconductor laser device permits lasing in three modes, namely, the fundamental mode and first and second order modes, in the crystal growth direction (i.e., y-direction in FIG. 4). It should be noted that for convenience of illustration FIG. 4 only shows the fundamental mode and the second order mode and does not show the first order mode. The sum of the optical confinement factors of the three active layers is 1.7% for the fundamental mode, 2.0% for the first order mode, and 2.8% for the second order mode. Since the sum of the optical confinement factors for the second order mode is largest (2.8%), this semiconductor laser device preferentially lases in the second order mode. It will be noted that the optical confinement factor of an active layer is the percentage of light confined to the active layer.

[Advantages of First Embodiment]

The advantages of the semiconductor laser device of the present embodiment will now be described. For comparison purposes, a comparative semiconductor laser device will be first described. This semiconductor laser device has a single active layer and differs from the semiconductor laser device of the present embodiment substantially in that it does not have the barrier layers 15 and 17, that the n-side $In_{0.49}Ga_{0.51}P$ guiding layer 13 and the p-side $In_{0.49}Ga_{0.51}P$ guiding layer 19 have a thickness of 600 nm, and that the active layer is sandwiched between these guiding layers. The optical confinement factor in the active layer of this semiconductor laser device was found to be 1.4%.

On the other hand, the semiconductor laser device of the present embodiment has three active layers, which are disposed near the locations of extreme points of the electric field of the second order mode. As a result of this construction, the sum of the optical confinement factors of the active layers is very large, namely, 2.8%, resulting in a reduced threshold current and hence an increased electrical-to-optical power conversion efficiency. In the above description of the present embodiment, the active layers have been described as being disposed near the locations of extreme points of the electric field. A more specific description will now be given of the positions of the active layers. Each active layer is preferably disposed between the locations on both sides of a respective extreme point where the absolute value of the strength of the electric field is reduced to ½ of that at the extreme point. That is, referring to FIG. 4, the $GaAs_{1-y}P_y$ active layer 14 is preferably disposed in the region W defined between the points where the strength of the electric field is Ep/2, where Ep is the strength of the electric field at the extreme point.

In the semiconductor laser device of the present embodiment, the sum of the optical confinement factors of the active layers is larger for the second order mode than for the other modes. Therefore, although the waveguide structure permits lasing in three modes, namely, the fundamental mode and the first and second order modes, the semiconductor laser device preferentially lases only in the second order mode, avoiding mode competition due to multimode lasing.

The following should be noted: the n-type $(Al_xGa_{1-x})_{0.51}In_{0.49}P$ cladding layer 3 of the present embodiment is referred to in the Summary of the Invention section as an "n-type cladding layer"; the p-type $(Al_xGa_{1-x})_{0.51}In_{0.49}P$ cladding layer 9, a "p-type cladding layer"; the multilayer structure consisting of the n-side $In_{0.49}Ga_{0.51}P$ guiding layer 13, the $GaAs_{1-y}P_y$ active layer 14, the $In_{0.49}Ga_{0.51}P$ barrier layer 15, the $GaAs_{1-y}P_y$ active layer 16, the $In_{0.49}Ga_{0.51}P$ barrier layer 17, the $GaAs_{1-y}P_y$ active layer 18, and the p-side $In_{0.49}Ga_{0.51}P$ guiding layer 19, an "optical waveguide portion; and the $GaAs_{1-y}P_y$ active layers 14, 16, and 18, "active layers."

Second Embodiment

A second embodiment of the present invention, like the first embodiment, relates to a semiconductor laser device configured to be able to lase in modes up to the second order mode, inclusive. However, this semiconductor laser device differs from that of the first embodiment in the number and the positions of the active layers. More specifically, the semiconductor laser device of the present embodiment includes only two active layers, while that of the first embodiment includes three active layers. In the present embodiment the active layers are respectively disposed near the locations of two extreme points of the electric field of the first order mode, while in the first embodiment the active layers are disposed near the locations of extreme points of the electric field of the second order mode.

[Configuration of Second Embodiment]

Figure 5:
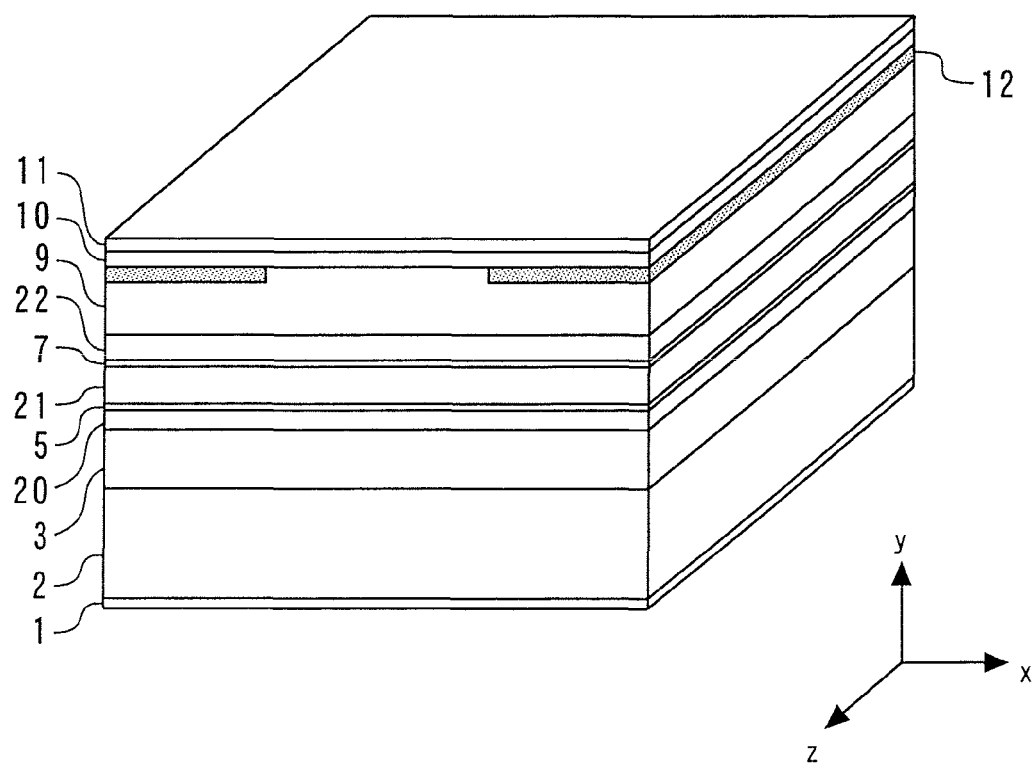
FIG. 5 is a perspective view of a semiconductor laser device of a second embodiment of the present invention.

The configuration of the semiconductor laser device of the present embodiment will be first described with reference to FIG. 5. FIG. 5 is a perspective view of an 810 nm semiconductor laser device of the second embodiment. In FIG. 5, reference numeral 20 denotes an n-side $In_{0.49}Ga_{0.51}P$ guiding layer with a thickness of 300 nm, reference numeral 21 denotes an $In_{0.49}Ga_{0.51}P$ barrier layer with a thickness of 600 nm, and reference numeral 22 denotes a p-side $In_{0.49}Ga_{0.51}P$ guiding layer with a thickness of 300 nm. The other components are identical to those carrying the same reference numerals in FIG. 1.

The structure of this semiconductor laser device permits lasing in three modes, namely, the fundamental mode and the first and second order modes in the crystal growth direction (i.e., y-direction in FIG. 5). The sum of the optical confinement factors of the two active layers is 1.8% for the fundamental mode, 2.2% for the first order mode, and 0% for the second order mode. Since thus the sum of the optical confinement factors for the first order mode is largest (2.2%), the semiconductor laser device preferentially lases in the first order mode.

[Advantages of Second Embodiment]

The advantages of the semiconductor laser device of the present embodiment will now be described. For comparison purposes, a comparative semiconductor laser device will be first described. This comparative semiconductor laser device has a single active layer and differs from the semiconductor laser device of the present embodiment substantially in that it does not have the barrier layer 21, that the n-side $In_{0.49}Ga_{0.51}P$ guiding layer and the p-side $In_{0.49}Ga_{0.51}P$ guiding layer have a thickness of 600 nm, and that the active layer is sandwiched between these guiding layers. The optical confinement factor in the active layer of this semiconductor laser device was found to be 1.4%.

On the other hand, the semiconductor laser device of the present embodiment is configured to able to lase in three modes, and has two active layers, which are disposed near the locations of extreme points of the electric field of the first order mode. As a result of this construction, the sum of the optical confinement factors of the active layers is very large, namely, 2.2%, resulting in a reduced threshold current and hence an increased electrical-to-optical power conversion efficiency.

Thus, the waveguide structure of the semiconductor laser device of the present embodiment permits lasing in three modes, namely, the fundamental mode and the first and second order modes. However, since the sum of the optical confinement factors of the active layers is larger for the first order mode than for the other modes, this semiconductor laser device preferentially lases only in the first order mode, avoiding mode competition due to multimode lasing.

Variations of First and Second Embodiments

The semiconductor lasers of the above embodiments are configured to be able to lase in modes up to the second order mode, inclusive. However, the present invention is not limited to this particular configuration. The present invention can also be applied to semiconductor laser devices configured to be able to lase in modes up to a higher order mode (e.g., the third or fourth order mode, etc.). Specifically, in the case of a semiconductor laser device configured to be able to lase in modes up to the m-th order mode (where m>2) in the crystal growth direction, the active layers may be disposed near the locations of n+1 extreme points of the electric field of the n-th order mode (where $n \leq m$). This results in a reduced threshold current and hence an increased electrical-to-optical power conversion efficiency, as in the first and second embodiments. Further, this arrangement allows the semiconductor laser device to preferentially lase only in the n-th order mode, avoiding mode competition.

It should be noted that the above n-th order mode is one of the modes up to the m-th order mode (which include the fundamental mode and the first and second order modes) other than the fundamental mode. That is, the n-th order mode is one of the high order modes, and is referred to in the Summary of the Invention section as a "particular high order mode."

Further, the present invention is not limited to the thicknesses and compositions of the layers described above in connection with the first and second embodiments.

In the semiconductor laser devices of the above embodiments, proton implantation is used to confine the current and thereby enhance the current injection efficiency. However, the present invention is not limited to this particular type of semiconductor laser device. The present invention may be applied to semiconductor laser devices in which current is confined by use of an insulating film, a waveguide (e.g., a ridge waveguide), or a buried current blocking layer such as a buried n-GaAs semiconductor layer.

In the semiconductor laser devices of the above embodiments, the refractive index is uniform in a direction perpendicular to the crystal growth direction. The advantages of these semiconductor laser devices have been described above. However, the present invention may be applied to other suitable types of semiconductor lasers, such as broad area semiconductor lasers having a ridge structure, etc. that causes the refractive index to vary in a direction perpendicular to the crystal growth direction, and single mode semiconductor lasers which lase in a single horizontal transverse mode.

Although the above embodiments have been described with reference to 810 nm semiconductor lasers, it is to be understood that the present invention is not limited to such lasers. The present invention may be applied to semiconductor lasers lasing at other wavelengths, such as 400 nm blue semiconductor lasers, 660 nm red semiconductor lasers, 780 nm semiconductor lasers, 900 nm semiconductor lasers, 1300 nm semiconductor lasers, and 1550 nm semiconductor lasers.

The configurations of the above embodiments may be applied to semiconductor laser devices including lases for DVD writing or information processing, solid state lasers such as Nd-doped YAG (Nd:YAG) lasers and Yb-doped YAG (Yb:YAG) lasers, pumping source lasers such as Yb-doped fiber lasers and Er-doped fiber amplifiers, and lasers for optical communications.

It should be noted that Japanese Laid-Open Patent Publication No. 2001-298241 discloses a semiconductor laser device configured to be able to lase in the fundamental mode and the first order mode. In this semiconductor laser device, at least one quantum well structure is disposed within 0.1 μm of the location of each extreme point of the optical intensity of the first order mode. However, this publication mentions that if the sum of the thicknesses of the optical guiding layers is large (specifically, 1.4 μm or more), multimode lasing may occur resulting in mode competition. Thus, this prior art semiconductor laser device is disadvantageous in that it may suffer mode competition. Therefore, as can be seen from the above description, the publication does not seem to recommend using this prior art technique for the second and higher order modes; it does not take into account these high order modes. On the other hand, the semiconductor laser devices of the first and second embodiments are configured to be able to lase in modes up to the second or higher order mode, and are adapted to preferentially lase in a particular high order mode higher than the first order mode. This ensures that these semiconductor laser devices have a reduced threshold current and hence an increased electrical-to-optical power conversion efficiency while preventing mode competition.

The semiconductor laser devices of the above embodiments differ from the prior art semiconductor laser device of the above publication in the following respects.

Paragraph 0029 of the above publication mentions that this prior art semiconductor laser device has a higher threshold current than other prior art semiconductor laser devices. It will be noted that the threshold current of a semiconductor laser device is determined by its gain and loss. Generally, the more active layers (or wells), the higher the injection current required to make the gain positive. Some low loss semiconductor laser devices (e.g., those constructed such that the reflectance of the facets is high to reduce the amount of light exiting the resonator) have a high threshold current. The above prior art semiconductor laser device is considered to be of such a type.

On the other hand, the more active layers (or wells) the higher the saturated gain. (The gain saturates with increasing injection current.) In the case of semiconductor laser devices, such as high power semiconductor laser devices, which are constructed such that a large amount of light exits the resonator, the threshold current decreases with increasing saturated gain since the reflectance of the facets is designed to be relatively low. The semiconductor laser devices of the above embodiments are of this type.

Thus, the semiconductor laser devices of the above embodiments exhibit a reduced threshold current and hence an increased electrical-to-optical power conversion efficiency; that is, they consume less power than prior art semiconductor laser devices of the same type. Further, the present invention can be used to reduce the size of semiconductor laser devices and the amount of raw material required to manufacture them. The present invention can also be used to extend the life of semiconductor laser devices, provide manufacturing advantages, and reduce the environmental impacts throughout the product's life cycle, which are examined by life cycle assessment (LCA).

The features and advantages of the present invention may be summarized as follows:

According to the first aspect of the present invention, a semiconductor layer device configured to be able to lase in three or more modes in the crystal growth direction, in which device a plurality of active layers are disposed near the locations of a plurality of extreme points of the electric field of a particular high order mode. The particular high order mode is one of the three or more modes other than the fundamental mode. This arrangement allows the waveguide structure of the semiconductor laser device to have a higher optical confinement factor than the waveguide structure of semiconductor laser devices configured to lase only in the fundamental mode in the crystal growth direction. Further, this semiconductor laser device lases only in the particular high order mode, avoiding mode competition due to multimode lasing. Thus, the semiconductor laser device is adapted to have a low threshold current and hence a high electrical-to-optical power conversion efficiency with reduced mode competition.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-290923, filed on Nov. 13, 2008 including specification, claims, drawings and summary, on which the Convention priority of the present application is based, are incorporated herein by reference in its entirety.

What is claimed is:

1. An edge-emitting semiconductor laser device comprising:
   an n-type cladding layer;
   a p-type cladding layer; and
   an optical waveguide disposed between and defined by said n-type and p-type cladding layers and by opposed facets through which light generated in the edge-emitting semiconductor laser is emitted and that are transverse to said n-type and p-type cladding layers, said optical waveguide including a plurality of spaced-apart active layers producing a refractive index distribution, transverse to said active layers, which supports lasing, in a direction transverse to said active layers, in at least three modes, including a fundamental mode and a plurality of higher order modes, wherein
      the electric field of a particular one of the plurality of higher order modes of oscillation includes a plurality of extreme points,
      the number of active layers is at least equal to the number of extreme points, and
      at least one of said active layers is disposed near each extreme point of the extreme points of the electric field of the particular higher order mode of oscillation within said optical waveguide.

2. The edge-emitting semiconductor laser device according to claim 1, wherein:
   the particular higher order mode is the second or higher order mode of oscillation; and
   at least one of said active layers is disposed near each of at least three extreme points of the electric field of the particular higher order mode of oscillation.

3. The edge-emitting semiconductor laser device according to claim 1, wherein the particular higher order mode of oscillation is the highest order one of the at least three modes of oscillation.

4. The edge-emitting semiconductor laser device according to claim 1, wherein:
   the at least three modes of oscillation are the fundamental mode of oscillation, the first order mode of oscillation, and the second order mode of oscillation;
   the particular higher order mode of oscillation is the second order mode of oscillation; and
   at least one of said active layers is disposed near each of three extreme points of the electric field of the particular higher order mode of oscillation.

5. The edge-emitting semiconductor laser device according to claim 1, wherein said at least one of said active layers is disposed between locations where the electric field is one-half of that at each of the extreme points.

6. The edge-emitting semiconductor laser device according to claim 2, wherein said at least one of said active layers is disposed between locations where the electric field is one-half of that at each of the extreme points.

7. The edge-emitting semiconductor laser device according to claim 3, wherein said at least one of said active layers is disposed between locations where the electric field is one-half of that at each of the extreme points.

8. The edge-emitting semiconductor laser device according to claim 1 including a respective barrier layer interposed between each pair of said active layers.

* * * * *